United States Patent [19]

Hubner et al.

[11] Patent Number: 5,573,592
[45] Date of Patent: Nov. 12, 1996

[54] METHOD FOR FORMING PURE GROUP III-V COMPOUND SEMI-CONDUCTOR FILMS

[75] Inventors: Andreas Hübner, Hameln, Germany; Scott R. Lucas, Pittsburgh, Pa.; William D. Partlow, Export, Pa.; W. J. Choyke, Pittsburgh, Pa.; J. A. Schäfer, Baunatal, Germany; John T. Yates, Jr., Allison Park, Pa.

[73] Assignee: University of Pittsburgh of the Commonwealth system of Higher Education, Pittsburgh, Pa.

[21] Appl. No.: 361,838

[22] Filed: Dec. 22, 1994

[51] Int. Cl.⁶ ................................................ C30B 25/20
[52] U.S. Cl. ........................... 117/89; 117/1; 117/84
[58] Field of Search ............................ 117/1, 84, 89, 117/92, 104, 904

[56] References Cited

PUBLICATIONS

Johnson et al., "Nitrogen Compounds of Gallium III. Gallic Nitride", *J. Phys. Chem.*, 36, pp. 2651–2654, 1932.
Addamiano, "On the Preparation of the Nitrides of Aluminum and Gallium", *J. Electrochem. Soc.*, 108, p. 1072, 1961.
Schmidt et al., "Comment on '0.2–W Repetitively Pulsed Flashlamp–Pumped Dye Laser'", *Appl. Phys. Lett.*, vol. 20, No. 2, pp. 71–73, 1972.
DenBaars et al., "Homogeneous and Heterogeneous Thermal Decomposition Rates of Trimethylgallium and Arsine and Their Relevance to the Growth of GaAs by MOCVD", *Journal of Crystal Growth*, vol. 77, pp. 188–193, 1986.
Eenshuistra et al., "Observation of Exceptionally High Vibrational Excitation of Hydrogen Molecules Formed by Wall Recombination", *Physical Review Letters*, vol. 60, No. 4, pp. 341–344, 1988.
Hall et al., "Vibrational Excitation of Hydrogen via Recombinative Desorption of Atomic Hydrogen Gas on a Metal Surface", *Physical Review Letters*, vol. 60, No. 4, pp. 337–340, 1988.

Sinniah et al., "New Mechanism for Hydrogen Desorption from Covalent Surfaces: The Monohydride Phase on Si(100)", *Physical Review Letters*, vol. 62, No. 5, pp. 567–570, 1989.
Förster et al., "Surface Reactions of Trimethylgallium and Trimethylarsenic on Silicon Surfaces", *J. Vac. Sci. Technol. B*, vol. 7, No. 4, pp. 720–724, 1989.
Sinniah et al., "Hydrogen Desorption from the Monohydride Phase on Si(100)", *J. Chem. Phys.*, vol. 92, No. 9, pp. 5700–5711, 1990.
Gow et al., "The Pyrolysis of Trimethylgallium on a Heated Si(100) Substrate", *Journal of Crystal Growth*, vol. 106, pp. 577–592, 1990.
Lykke et al., "State–to–State Inelastic and Reactive Molecular Beam Scattering from Surfaces", *SPIE vol. 1208 Laser Photoionization and Desorption Surface Analysis Techniques*, pp. 18–29, 1990.

(List continued on next page.)

*Primary Examiner*—Robert Kunemund
*Assistant Examiner*—FeLisa Garrett
*Attorney, Agent, or Firm*—Jolene W. Appleman; Arnold B. Silverman; Eckert Seamans Cherin & Mellott

[57] ABSTRACT

This invention discloses a method of synthesizing a Group III-V compound semi-conducting film from a Group III metal alkyl and Group V hydride wherein the method comprises providing a vacuum chamber in which the synthesis takes place, adsorbing at least one monolayer of said Group III metal alkyl on an inert surface, backfilling the chamber with a Group V hydride, adsorbing the Group V hydride on the inert surface, providing atomic hydrogen atoms from electron-induced dissociation of Group V hydride adsorbed on the surface, inducing an electron-induced depletion of carbon at a rate which is dependent on the pressure of the Groups V hydride, retaining substantially all Group III metal on the surface and providing a thermally stable Group III-V compound semi-conducting film on the inert $SiO_2$ surface. Methods for synthesizing a multilayer Group III-V semi-conducting film and specifically a GaN film are also disclosed, along with the apparatus for the synthesis of Group III-V compound semi-conducting films.

9 Claims, 9 Drawing Sheets

OTHER PUBLICATIONS

Okumura et al., "Epitaxial Growth of Cubic and Hexagonal GaN on GaAs by Gas–Source Molecular–Beam Epitaxy", *Appl. Phys. Lett.*, vol. 59, No. 9, pp. 1058–1060, 1991.

Flores et al., "SSIMS Identification of Surface Intermediates in the Thermal Decomposition of TMGa on Si(100)", *Surf. Sci.*, vol. 261, pp. 99–110, 1992.

Strite et al., "GaN, AlN, and InN: A Review", *J. Vac. Sci. Technol. B*, vol. 10, No. 4, pp. 1237–1266, 1992.

Cheng et al., "Atomic Hydrogen–Driven Halogen Extraction from Si(100): Eley–Rideal Surface Kinetics", *J. Am. Chem. Soc.*, vol. 114, pp. 1249–1252, 1992.

Rettner, "Dynamics of the Direct Reaction of Hydrogen Atoms Adsorbed on Cu(111) with Hydrogen Atoms Incident from the Gas Phase", *Physical Review Letters*, vol. 69, No. 2, pp. 383–386, 1992.

Yates et al., "Atomic H: A Reagent for the Extraction of Chemical Species from Si Surfaces", *Thin Solid Films*, vol. 225, pp. 150–154, 1993.

Rubin et al., "p–Type Gallium Nitride by Reactive Ion––Beam Molecular Beam Epitaxy with Ion Implantation, Diffusion, or Coevaporation of Mg", *Appl. Phys. Lett.*, vol. 64, No. 1, pp. 64–66, 1994.

Rettner et al., "Distinguishing the Direct and Indirect Products of a Gas–Surface Reaction", *Science*, vol. 263, pp. 365–367, 1994.

Hubner et al., "GaN Patterned Film Synthesis—Carbon Depletion by Hydrogen Atoms Produced from $NH_3$ Activated by Electron Impact", submitted to *J. Vac. Sci. Technol. A*, Nov. 29, 1994.

METHOD FOR FORMING PURE GROUP III-V COMPOUND SEMI-CONDUCTOR FILMS

BACKGROUND OF THE INVENTION

1. Field of the Invention

This invention relates to non-thermal electron-induced reactions of Group V hydrides with a surface layer produced by adsorption of Group III metal alkyls on an inert surface. The atomic hydrogen (H) produced by electron-induced dissociation of Group V hydrides to form the species (Group V) $H_x$ and H, efficiently extracts the alkyl groups from the Group III metal alkyl layer leading to chemical activation and to carbon removal from the Group III-V compound semi-conductor film which is formed. More particularly, the invention relates to a method of synthesizing a GaN compound semi-conductor film from trimethylgallium (TMG) and ammonia.

2. Description of the Prior Art

The III-V compounds, in particular the wide band gap nitrides, are very attractive semi-conductors for light emission applications in the blue and UV wavelengths at high temperatures. [S. Strite et al., *J. Vac. Sci. Technol.* B. 10, 1237 (1992).] The effort to produce high quality films of Group III-V compounds can be traced back to the 1960's where much work was initiated in an attempt to better understand compounds such as GaN, InN, and AlN. The earliest GaN samples studied were in the form of powder samples or small crystals. [W. C. Johnson et al., *J. Phys. Chem*, 36, 2651 (1932).] The most prevalent technique for producing these nitride compounds was to place metallic Ga in a zone furnace and to flow $NH_3$ over it, [W. C. Johnson et al., *J. Phys. Chem*, 36, 2651 (1932)] or to use a gallium phosphide or gallium arsenide, [A. Addamiano, *J. Electrochem. Soc.*, 108, 1072 (1961)] or a gallium subchloride source for transport of Ga into the furnace. [H. P. Maruska et al., *Appl. Phys. Lett.*, 15, 327 (1969).] Another common growth technique was the use of reactive sputtering. This method employed Ar ions to sputter a Ga film in the presence of a nitrogen plasma. [H. J. Hovel et al., *Appl. Phys. Lett.*, 20, 71 (1972).] The GaN produced by these methods was suitable to investigate and characterize many of its properties; however, material good enough for electronic applications was still elusive. Heteroepitaxial growth was finally realized by the use of chemical vapor deposition (CVD) techniques. [S. Strite et al., *J. Vac. Sci. Technol.* B. 10, 1237 (1992).] This permitted the production of high quality films where the principal problems dealt with finding suitable substrates for a good lattice match, elimination of very high background n-type carrier concentrations thought to be due to nitrogen vacancies, and the incorporation of dopants. The problem of a proper substrate lattice match that is also thermally compatible with the GaN thin film has been investigated by the use of substrate materials such as SiC, ZnO, and MgO. [S. Strite et al., *J. Vac. Sci. Technol.* B. 10, 1237 (1992).] The production of stoichiometric GaN is still a major obstacle for producing electronic grade films. Lower growth temperatures that might allow better nitrogen incorporation from more reactive nitrogen-containing precursors are being considered. [H. Okumura et al., *Appl. Phys. Lett.*, 59, 1058 (1991); M. Rubin et al., *Appl. Phys. Lett.*, 64, 64 (1994).]

The growth of the III-V nitrides, in thin film form using metal organic chemical vapor deposition (MOCVD) and molecular beam epitaxy (MBE), is now widespread and many variations of these two techniques are in use and are just beginning to be understood. In particular, the thermal decomposition of trimethylgallium, $Ga(CH_3)_3$, (TMG) in the presence of $NH_3$ can be used for GaN film production. [A. Förster et al., *J. Vac. Sci. Technol.*, B7, 720 (1989).] However, this type of process is known to leave carbon behind, which can be deleterious to III-V semi-conductor films [T. R. Gow et al., *Vacuum*, 41, 951 (1990); C. R. Flores et al., *Surf. Sci.*, 261, 99 (1992); T. R. Gow et al., *J. of Crystal Growth*, 106, 577 (1990); and S. P. Den Baars et al., *J. Cryst. Growth*, 77, 188 (1986)].

Therefore, there remains a very real and substantial need for a method and apparatus working at low temperatures that forms very pure Group III-V compound semi-conductor films, wherein carbon is efficiently removed, particularly wide band gap nitrides, for light emission applications in the blue and UV wavelengths.

SUMMARY OF THE INVENTION

The present invention has met the hereinbefore described need. The present invention provides a low temperature method of making Group III-V compound semi-conducting films from Group III metal alkyls and Group V hydrides where substantial depletion of carbon is accomplished using a new procedure. The method comprises providing a vacuum chamber in which the reaction takes place, adsorbing at least one monolayer of Group III metal alkyl on the surface of an inert substrate such as $SiO_2$, backfilling the chamber with a pressure of at least about $5 \times 10^{-7}$ torr of ammonia, and adsorbing the Group V hydride on the surface. Atomic hydrogen species are provided from electron-induced dissociation of the Group V hydride adsorbed on the surface. The hydrogen atom removes an alkyl group from the surface of the substrate, keeping the Group III metal and a (Group V) $H_x$ (x<3) species on the surface of the substrate and, by repetition of this alkyl removal process, ultimately producing a thermally stable Group III-V compound film on the surface of the inert substrate. The monolayer of the Group III metal alkyls on the $SiO_2$ surface is formed at about 97–138 K. The method also includes increasing the rate of extraction of alkyl groups by increasing the rate of production of hydrogen atoms from the Group V hydride on the surface. The method also includes repeating the procedure to provide multilayer Group III-V compound semi-conductor films. The surface is heated to about 200–900 K after the growth of the first layer and higher layer. The method also includes producing atomic hydrogen by an electron beam. While low surface temperatures were initially used to capture and retain the metal alkyl on the surface, the concept developed will also work well at higher temperature if a continuous supply of the III-V alkyl to the surface is maintained from the gas phase.

The present invention also provides apparatus for synthesis of Group III-V compound semi-conducting films from Group III metal alkyls and Group V hydrides. The apparatus comprises a vacuum chamber with a base pressure of $1 \times 10^{-10}$ torr to avoid contamination effects, means for adsorbing at least one monolayer of Group III metal alkyl on the surface of an inert substrate in the chamber, and means for backfilling the chamber with a pressure of at least $5 \times 10^{-7}$ torr of ammonia. The apparatus also includes means for producing H atoms from the dissociation of the Group V hydride adsorbed on the surface of the substrate, means for removing the alkyl groups from the substrate in the presence of the dissociated Group V hydride, and means for retaining the Group III metal and means for producing a thermally stable Group III-V compound semi-conducting film on the inert surface. The apparatus also includes means for reacting atomic hydrogen dissociated from the ammonia with the Group III metal alkyl species adsorbed on the inert substrate surface and eliminating the alkyl groups using the atomic hydrogen. The apparatus also includes means for increasing the rate of extraction of alkyl groups by increasing the rate of production of the hydrogen atoms from the Group V hydride on the surface. The apparatus also includes means for repeating the procedure to produce multilayer Group III-V compound semi-conductor films. The apparatus also includes means for heating the surfaces after the growth of the first and higher layers. The method also includes producing said atomic hydrogen by an electron beam. The apparatus also includes means for producing a multilayer GaN film from $Ga(CH_3)_3$ and $NH_3$.

Potential uses for these Group III-V semi-conducting films are in several important technological areas, for example, as a visible light emitter, which has potential as a replacement for neon signs and for panel display devices. The electrical excitation of GaN and other III-V compounds leads to light emission in the visible spectrum. These semi-conducting films may also be useful as opto-electronic materials useful at high temperature. For example, the opto-electronic material may be used in devices designed to internally monitor the performance of turbine engines.

It is an object of this invention to make pure Group III-V compound semi-conducting films from Group III metal alkyls and Group V hydrides.

It is an object of this invention to use the atomic hydrogen produced by the electron-induced dissociation of Group V hydrides to extract the methyl and other alkyl groups from trimethylgallium leading to chemical activation and to carbon removal from the Group III-V compound semi-conducting films formed.

It is an object of this invention to use a process that is non-thermal.

It is an object of this invention to permit a Group III-V compound semi-conducting film to be deposited in a localized region which has been bombarded by an electron beam.

It is an object of this invention to grow monolayers and multilayer films of Group III-V compounds.

It is an object of this invention to use direct writing of Group III-V compound features with an electron beam by the method of this invention.

It is yet another object of this invention to make high quality GaN film for use as an opto-electronic material applicable for blue and violet emitting devices.

It is yet another object of this invention to make the GaN film to be used at high temperatures.

These and other objects of the invention will more fully understood from the figures and the following description of the invention and the claims appended hereto.

DESCRIPTION OF THE PREFERRED EMBODIMENT

Figure 1A:
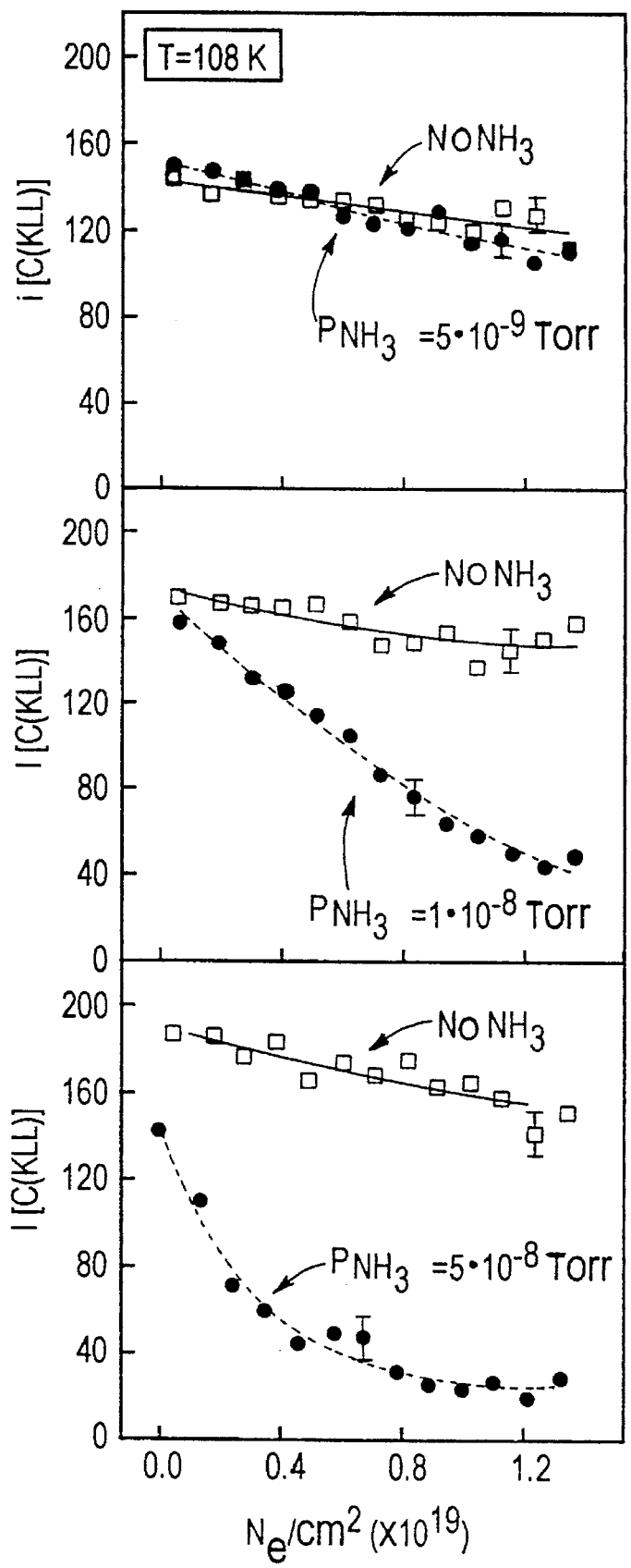
FIG. 1 discloses an electron-induced reaction of $NH_3$ with $Ga(CH_3)_x$ supported on an inert $SiO_2$ surface as shown by Auger spectroscopy, monitoring the C(KLL) Auger intensity behavior.

The activation of the Ga—$CH_3$ bond is a fundamental step in the production of Ga-based semi-conductor films using metal-organic chemical vapor deposition (MOCVD) methods. The activation of the Ga—$CH_3$ bond is a key prototype step for reactions of various metal alkyls involving the Group III metals with Group V hydrides to produce Group III-V semi-conductor films. The Ga—$CH_3$ bond in $Ga(CH_3)_3$ has a bond strength of 63±4 kcal/mole, and in the gas phase, $Ga(CH_3)_3$ is stable at temperatures below ~300K.

This invention reports the discovery of a non-thermally activated process for breaking the Ga—$CH_3$ bond, even at about 100K, using atomic hydrogen. This leads to the initiation of reactivity at the Ga atom site within the molecule, which is used to cause the eventual production of a Group III-V compound semi-conductor film. This invention discloses well-controlled kinetic studies of the H atom-induced elimination of $CH_3$ groups from monolayer films made by the adsorption of $Ga(CH_3)_3$ on an inert $SiO_2$ substrate. This invention discloses the use of atomic H, generated by electron bombardment of adsorbed $NH_3$, to directly produce a film of GaN, and shows that this method may be used to write a pattern of GaN on a substrate. It is envisioned that growth of GaN by this method will work at higher substrate temperatures using higher TMG and $NH_3$ pressures to maintain the appropriate surface coverage for efficient electron-impact induced GaN film growth.

The use of atomic hydrogen to eliminate $CH_3$ groups or other alkyl groups such as ethyl, propyl etc. from Group III metal alkyls is of importance in film growth processes where impurity carbon deposition is detrimental to the quality of the III-V film, as is well known, for example, for the case of GaAs films made by MOCVD methods. In addition, non-thermal deposition processes of this type often operate favorably at low temperatures.

The present invention provides a method of making Group III-V compound semi-conducting films from Group III metal alkyls and Group V hydrides. The method comprises providing a vacuum chamber in which the reaction takes place, adsorbing at least one monolayer of Group III metal alkyl on the surface of an inert substrate such as $SiO_2$, backfilling the chamber with a pressure of at least $5\times10^{-7}$ torr of ammonia and adsorbing said Group V hydride on said surface. Atomic hydrogen atoms are provided from electron-induced dissociation of the Group V hydride adsorbed on the surface. The hydrogen atom removes an alkyl group from the surface, keeping the Group III metal and a (Group V) $H_x$ (x<3) species on the surface of the substrate and ultimately producing a thermally stable Group III-V compound semi-conducting film on the inert substrate. The monolayer of the Group III metal alkyls on the $SiO_2$ surface is formed in these experiments at about 97–138K. The method includes reacting atomic hydrogen dissociated from the Group V hydride with the Group III-alkyl groups and using the atomic hydrogen to eliminate the alkyl groups. The method also includes increasing the rate of extraction of alkyl groups by increasing the rate of production of hydrogen atoms from ammonia on the surface. The method also includes repeating the procedure to provide multilayer Group III-V compound semi-conductor films. The surface is heated to about 200–900K after the growth of the first layer and higher layers. A multilayer GaN film can be produced by repeating this process.

The present invention also provides apparatus for synthesis of Group III-V compound semi-conducting films from Group III metal alkyls and Group V hydrides. The apparatus comprises a vacuum chamber with a base pressure of at least $1\times10^{-10}$ torr to avoid contamination effects. Means for adsorbing at least one monolayer of Group III metal alkyl on an inert surface of a substrate in the chamber, means for backfilling the chamber with a pressure of at least about $5\times10^{-7}$ torr of ammonia, means for exposing the crystal to an electron beam. The apparatus also includes means for producing H atoms from the dissociation of the ammonia adsorbed on the surface of the substrate, means for removing the alkyl groups from the substrate in the presence of the dissociated ammonia, and means for retaining the Group III metal for producing a thermally stable Group III-V compound semi-conducting film on the inert surface. The apparatus includes means for exposing the surface of the substrate to the electron beam. The apparatus also includes means for reacting atomic hydrogen dissociated from the ammonia with the Group III alkyl groups adsorbed on the inert substrate surface and eliminating the alkyl groups using the atomic hydrogen. The apparatus also includes means for increasing the rate of extraction of alkyl groups with the rate of production of the hydrogen atoms from the Group V hydride on the surface. The apparatus also includes means for repeating the procedure to produce multilayer Group III-V compound semi-conductor films. The apparatus also includes means for heating the surface after the growth of a first layer and after the growth of a second or higher layer. The apparatus also includes means for producing a multilayer GaN film from $Ga(CH_3)_3$ and $NH_3$.

Potential uses for these Group III-V semi-conducting films are in several important technological areas including as a visible light emitter, potentially as a replacement for neon signs and in flat panel display devices. The electrical excitation of GaN and other Group III-V compounds leads to light emission in the visible spectrum. These semi-conducting films may also be useful as an opto-electronic material useful at high temperature. For example, the opto-electronic material may be used in devices designed to internally monitor the performance of turbine engines.

The experiments were carried out in an ultra-high vacuum (UHV) chamber with a base pressure of about $1\times10^{-10}$ torr. The system is equipped with a cylindrical mirror analyzer (CMA) Auger electron spectrometer (AES), an Ar$^+$-ion sputter gun, a multiplexed quadrupole mass spectrometer, a reverse view low energy electron diffraction (LEED) apparatus and a calibrated microcapillary array doser. The mounting procedure for the Si(100) crystal (p-type, B doped, 10 Ω•cm, 13×13×1.5 mm$^3$) has been described previously in M. J. Bozack et al., *J. Vac. Sci. Tech.*, A5, 1 (1987). Final crystal cleaning is achieved by sputtering with Ar$^+$-ions ($E_i$=2 keV, $I_{Ar+}$=3.0 μA) and subsequent heating to 1200K. The heating is carried out resistively using a temperature programmer. SiO$_2$ films were prepared on the clean Si(100) crystal in the UHV chamber by a sputter-oxidation technique which employed approximately equal Ar and O$_2$ backing pressures ($p_{Ar}$=$p_{O_2}$=$2\times10^{-5}$ Torr). An ion energy of 500 eV was employed. The thickness of the as-formed SiO$_2$ film was estimated to be 15–25 Å using the attenuation of the Si$^0$ (92 eV) Auger feature characteristic of the underlying Si(100) substrate and assuming an electron escape depth of 6.5 Å for SiO$_2$. Trimethylgallium (99.9999% pure, Strem Chemicals) TMG) was further purified by a freeze—pump—thaw cycle. The gas molecules were delivered to the SiO$_2$ surface through the beam doser. Other studies indicate that almost pure TMG is emitted from the doser under the conditions of this experiment. The adsorption/desorption kinetics for TMG on SiO$_2$ have been studied previously using Auger spectroscopy and temperature programmed desorption (TPD) making it possible to estimate the layer thickness deposited in terms of monolayers. [S. R. Lucas et al., *J. Vac. Sci. Technol.* in press.] This yields an estimate of $2.4\times10^{14}$ molecules/cm$^2$ of TMG for the saturated monolayer.

All electron and ion beams currents reported here were those measured between the crystal and ground and are uncorrected for secondary electron yield. The AES measurements were carried out with a 3 keV primary excitation electron beam which delivered $I_e$=3 μA of current to the surface. The diameter of the electron beam was measured to be ~0.3 mm by translating the edge of the crystal through the electron beam and measuring the collected current. The modulation voltage was set at 6 V peak-to-peak for AES intensity measurements and 2 V peak-to-peak for AES line shape observations, respectively. The electron beam exposure used in these measurements was shown not to produce significant carbon depletion in control experiments carried out without a source of atomic hydrogen being present.

The electron-induced reaction of $NH_3$ with $Ga(CH_3)_x$ on an SiO$_2$ surface was done as follows:

EXAMPLE I

Experiments were carried out in which the source of atomic H was the electron bombardment of $NH_3(a)$ in the presence of a preadsorbed monolayer of $Ga(CH_3)_x$.

Figure 1B:
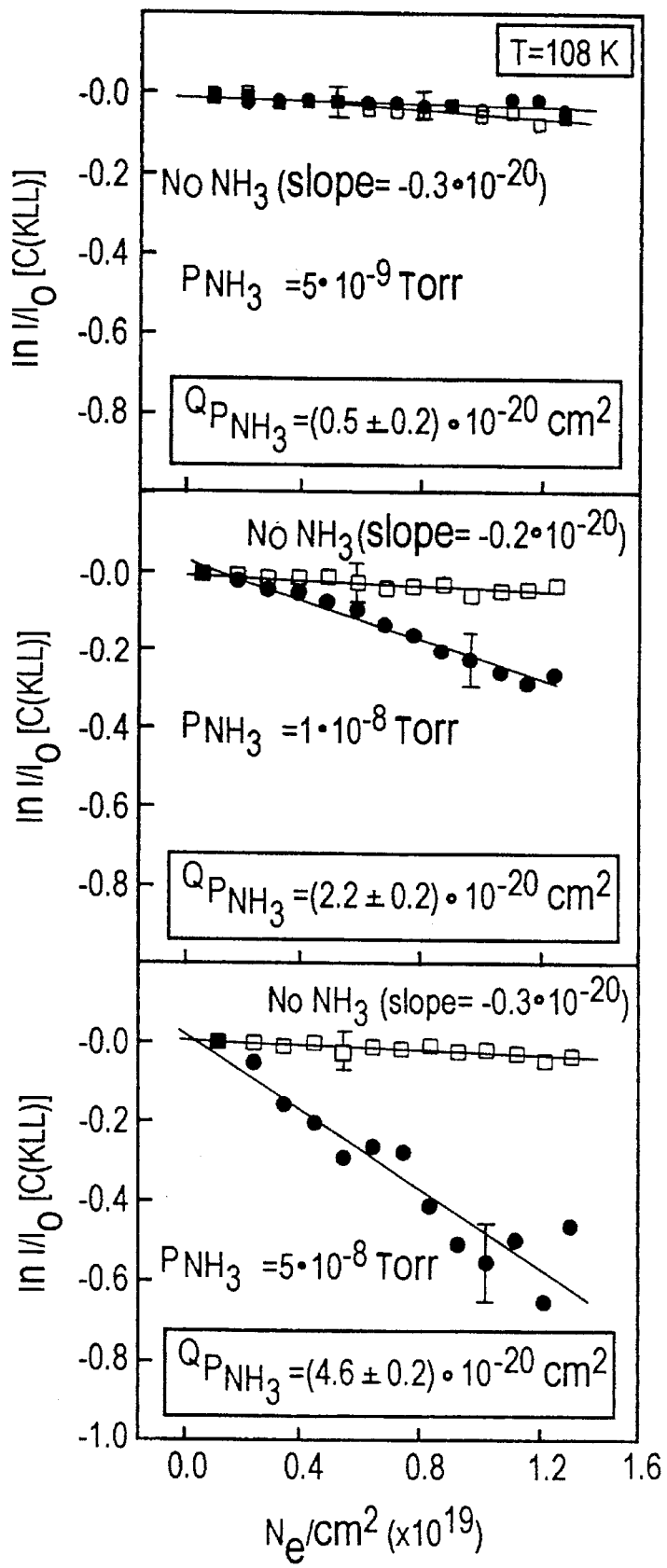

This was done by backfilling the chamber with various pressures of $NH_3$, thereby producing a steady state coverage of $NH_3(a)$ on the surface maintained at about 108K. This mixed layer was subjected to programmed electron bombardment (40s on; 30s off), using the electron beam from the Auger spectrometer. FIG. 1 shows the results of this experiment, where experiments at three $NH_3$ pressures are shown. On the left-hand side of FIG. 1, the decrease in the intensity of the C(KLL) carbon KLL Auger transition is shown. The Auger intensity, compared to control experiments with no $NH_3$, is shown for increasing exposure to electrons. The rate of $CH_3$ removal increases monotonically with the pressure of $NH_3$, and hence with the coverage of $NH_3$ and with the supply of atomic H produced from the adsorbed $NH_3$. FIG. 1 shows the electron-induced reaction of $NH_3$ with $Ga(CH_3)_x$/SiO$_2$. Shown is the C(KLL) Auger signal (left side) and its normalized natural logarithm (right side) versus the number of electrons per cm$^2$.

$$Q_{P_{NH_3}}$$

is the $NH_3$ pressure-dependent cross section for the depletion of the methyl-groups by the electron stimulated process. Linear semi-logarithmic plots, shown in the right-hand side of FIG. 1, indicate that the kinetics of removal of $CH_3$ groups are first-order in the surface coverage of $CH_3$ groups. A cross section, $$Q_{P_{NH_3}},$$

for the removal process may be determined from these plots, and the cross section is observed to increase for increasing $P_{NH_3}$.

Figure 2A:
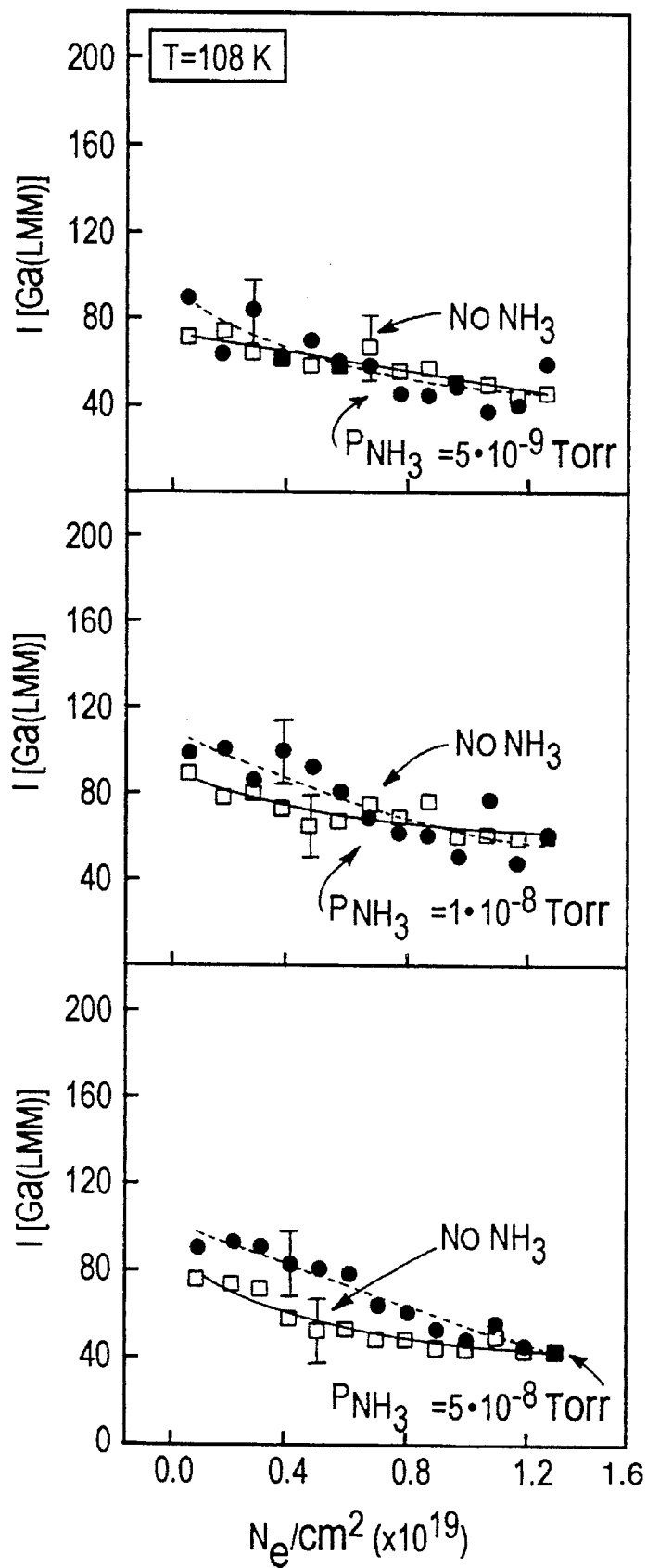
FIG. 2 shows the behavior of the Ga[LMM] Auger intensity behavior for the same experiment as shown in FIG. 1.
Figure 2B:
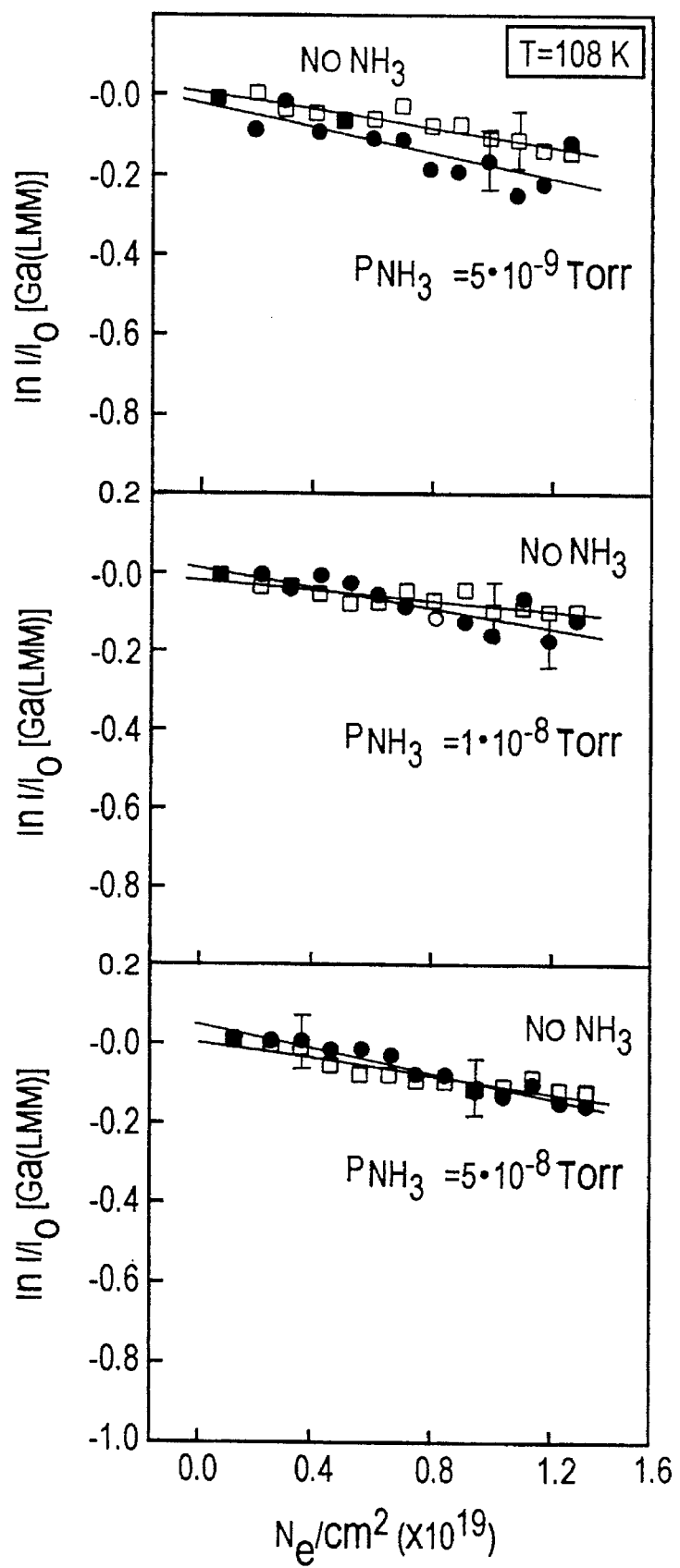
Figure 3A:
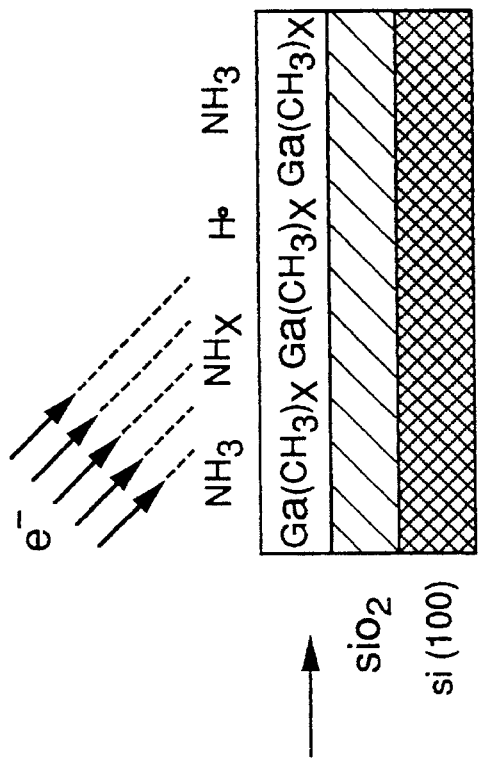
FIG. 3 discloses a schematic sequence of reaction events in carbon extraction and GaN formation.
Figure 3B:
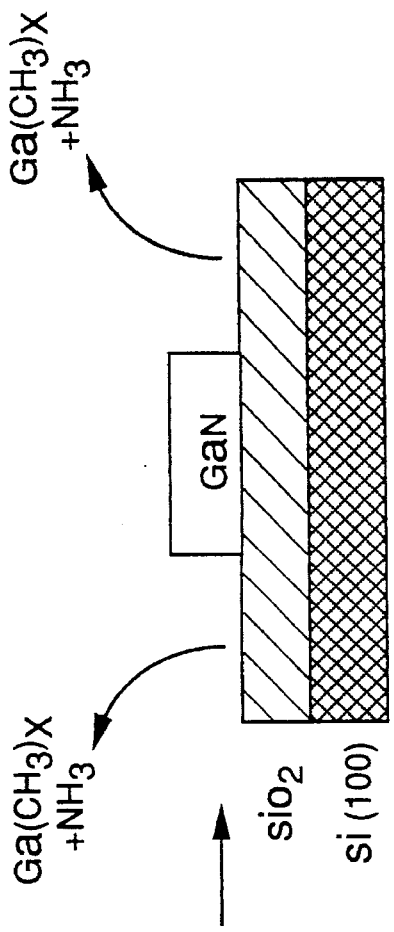
Figure 3C:
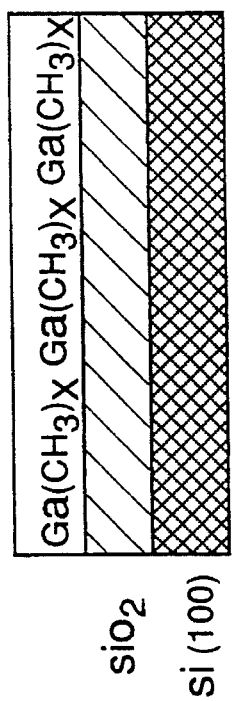
Figure 3D:
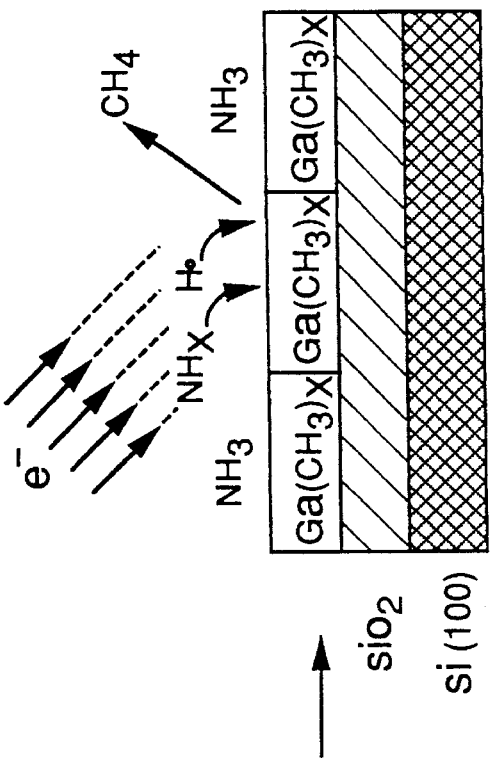

To test that $CH_3$ groups were being preferentially removed from the $Ga(CH_3)_x$ monolayer by the use of atomic H produced from $NH_3(a)$, FIG. 2 shows the behavior of the Ga(LMM) Auger intensity for the same experiment as shown in FIG. 1. Shown is the Ga(LMM) Auger signal (left side) and its normalized natural logarithm (right side) versus the number of electrons per cm². On the left-hand side of FIG. 2, the Ga(LMM) intensity is plotted versus the fluence of electrons; a semi-logarithmic plot of the Ga behavior is shown on the right-hand side of FIG. 2. It may be seen that to within experimental errors, the small rate of loss of Ga(LMM) intensity in the electron beam does not change when the $NH_3$ pressure is raised to $5\times10^{-8}$ Torr. A comparison of the rate of carbon loss and the rate of Ga loss (FIGS. 1 and 2) for the same pressure of $NH_3$ shows that the rate of carbon loss is comparatively high as a result of the interaction with the electron beam in the presence of $NH_3(a)$. Control experiments in a background pressure of $N_2$, monitoring both C and Ga, indicated that no measurable depletion effect exists as a result of the presence of $N_2$. The control experiment with $N_2$ instead of $NH_3$ was employed to distinguish between the role of electron-induced formation of N and H in the reaction. Even at $N_2$ surface coverages produced at an $N_2$ pressure of $P_{N2}=5\times10^{-8}$ Torr there is no influence (within the experimental uncertainty) on the rate of the C(KLL) and the Ga(LMM) loss processes. This leads to the conclusion that H derived from electron-induced dissociation of $NH_3(a)$ is needed for the extraction of the methyl-groups.

The postulated mechanism is:

a) Electron-induced dissociation of adsorbed $NH_3$ leads to the production of $NH_x(a)$ and H species. Since a 3 keV electron beam is employed, it is very likely that a backscattered and/or secondary electrons returning from the bulk to the surface also play an important role in this process.

b) Atomic hydrogen reacts with the methyl-groups of $Ga(CH_3)_x/SiO_2$ eliminating $CH_3$ groups efficiently.

c) During the irradiation with electrons GaN is formed. The GaN is thermally stable to 900K.

The mechanism accounts for increase of the cross section $Q_{P_{NH_3}}$, with increasing ammonia pressure, since the surface coverage of adsorbed $NH_3$ under dynamic conditions, and hence the supply of atomic hydrogen, will increase with increasing $P_{NH_3}$. Atomic hydrogen made from $NH_3$ removes the methyl-groups from trimethylgallium [TMG]. The rate of extraction of the methyl-groups increases with the rate of production of hydrogen atoms from $NH_3$ on the surface. As indicated by linear semilog plots in FIG. 1, the reaction is first-order in the surface concentration of $CH_3$ groups at a given $P_{NH_3}$. The cross section $Q_{P_{NH_3}}$, for depletion of carbon is of the order of about $10^{-20}$ cm² at $P_{NH_3}=5\times10^{-8}$ Torr.

It is of interest to compare the rate of the $CH_3$ depletion process with the flux of electrons and the flux of $NH_3$ onto the surface under these conditions. At the beginning of the $CH_3$ extraction process, we assume that a monolayer of the $Ga(CH_3)_x$ consists of $1\times10^{14}$ species/cm²=N. Then, for an electron flux, $F_e \approx 2\times10^{16}$ e/(cm²s), $$-dN/dt = N F_e Q_{P_{NH_3}} \approx 1 \times 10^{11}/(cm^2 s) \quad (2)$$
$$= \text{rate of } CH_3 \text{ loss.}$$

Under these conditions, the flux of $NH_3$, $F_{NH_3}$, from kinetic theory is ~200 times larger than the rate of the $CH_3$ loss, viz.

$$F_{NH_3}=P_{NH_3}/(2\pi m_{NH_3}kT_g)^{1/2} \approx 2\times10^{13} NH_3/(cm^2 s) \quad (3)$$

Thus, under the conditions of the experiment, as shown by the information in equation (2), each electron has an efficiency of order $5\times10^{-6}$ for causing a $CH_3$ extraction process. Assuming that electron stimulated desorption (ESD) effects have not caused significant depletion of $NH_3$ from a monolayer under the conditions of this experiment, a $CH_3$ extraction efficiency of $5\times10^{-6}$ is reasonable on the following grounds:

a) Two inefficient processes work in series causing the extraction process.
They are:

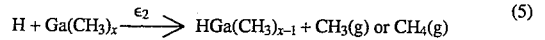

where $\epsilon_1$ is the efficiency to produce one H per collision of one electron with $NH_3(a)$ and $\epsilon_2$ is the efficiency of $CH_3$ extraction by the atomic H produced as described by equation (4).

b) In the extraction process by atomic H, an efficiency of order $10^{-2}$ is appropriate for $\epsilon_2$.

c) Thus, since the joint efficiency $\epsilon_2\epsilon_1$ is ~$5\times10^{-6}$/electron, $\epsilon_1$ is ~$5\times10^{-4}$, corresponding to a cross section of order $5\times10^{-19}$ cm² for breaking the N—H bond in adsorbed $NH_3$ by electron impact using 3 keV electrons (assuming a $NH_3$ coverage of the order of $10^{15}$/cm²). A value of ~$10^{-16}$ cm² for N—H bond breaking in chemisorbed $NH_3$ by 55 keV electrons has been measured on a Ni(110) surface.

Pattern formation during electron beam activation of $NH_3$ +$Ga(CH_3)_x$ layers was done as follows:

EXAMPLE II

Figure 4:
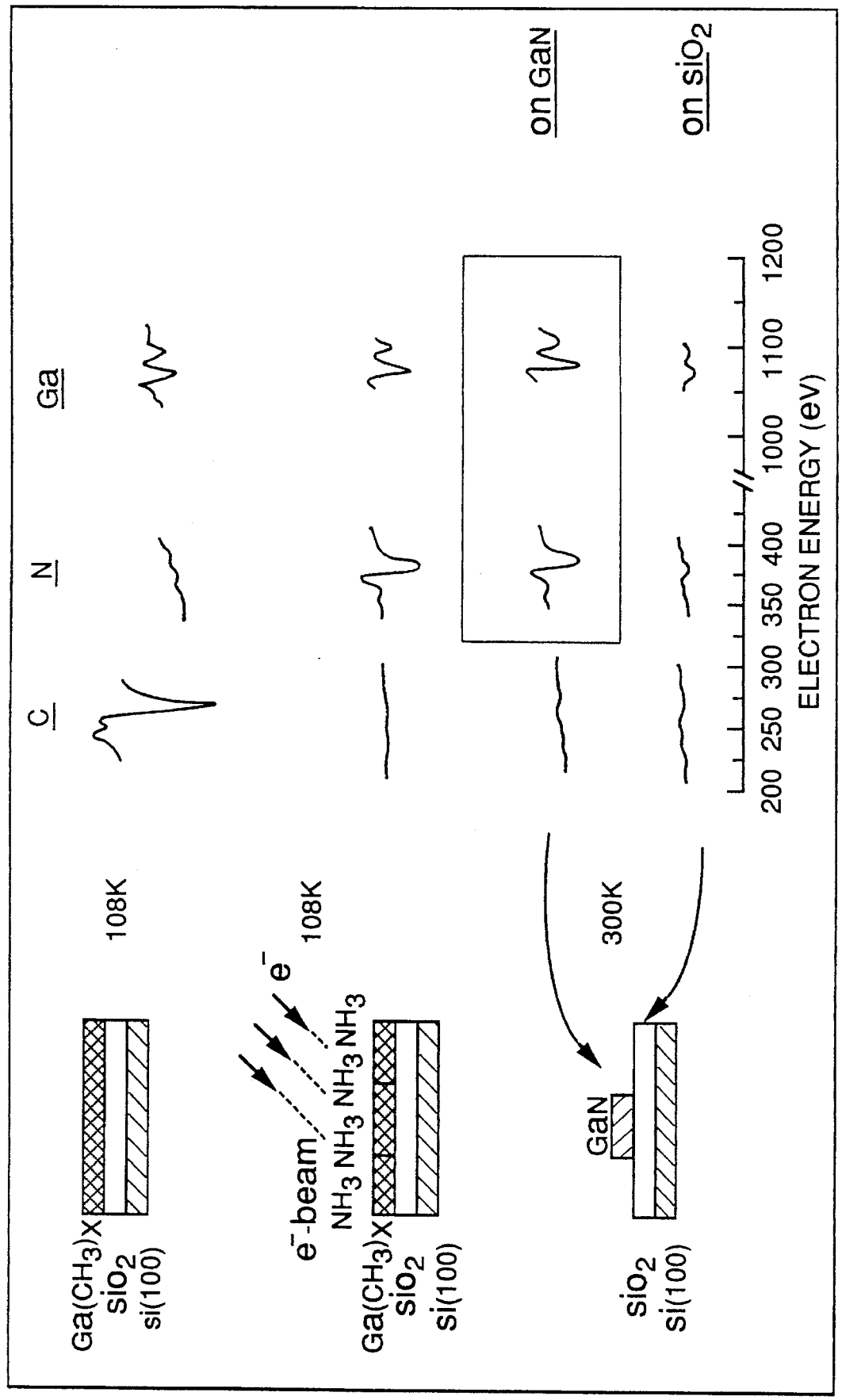
FIG. 4 discloses monolayer GaN synthesis on $SiO_2$ by using $NH_3$ and electron impact.

Applying the above method, it is possible to grow GaN on $SiO_2$ as schematically shown in FIG. 3. FIG. 3 discloses a schematic mechanism for GaN production by an electron-induced reaction of adsorbed $Ga(CH_3)_x$ with $NH_3$. Here, a monolayer of $Ga(CH_3)_x$ is exposed to $NH_3$, and a point region on the surface is irradiated with the electron beam. $NH_x(a)$ and H(a) species are produced and attack the $Ga(CH_3)_x$ layer, displacing the $CH_3$ groups, possibly through $CH_4$ formation. A "GaN" dot is produced. Heating the surface to 900K results in liberation of volatile species from the non-irradiated areas, leaving the GaN dot. The data supporting this schematic picture are shown in FIG. 4. FIG. 4 discloses monolayer GaN synthesis on $SiO_2$ by an electron-induced reaction of $Ga(CH_3)_x$ with $NH_3$ at about 108K. The left-hand side of FIG. 4 shows a schematic of the layer structure, while the right-hand side shows Auger spectroscopic data supporting the schematic picture. In the top row of FIG. 4, the Auger spectra of C and Ga are observed as expected from a $Ga(CH_3)_x$ layer at about 108 K. After extensive treatment of the surface with $NH_3$, in the presence of the electron beam, the carbon Auger intensity has been reduced to near zero as a result of the action of H atoms from the $NH_3$ on the $CH_3$ groups. In the second row of FIG. 4, only the Auger spectrum for N and Ga is observed in the irradiated region. Upon heating to only 300K, as shown in row three of FIG. 4, again only N and Ga are seen in the electron beam-irradiated spot. In the lower Auger spectra shown in FIG. 4, following the heating to 300K, only small signals from N and Ga are seen in regions away from the GaN dot, since thermal desorption of the $Ga(CH_3)_x$ and $NH_3$ species has occurred in these non-irradiated regions after heating to 300K.

Figure 5:
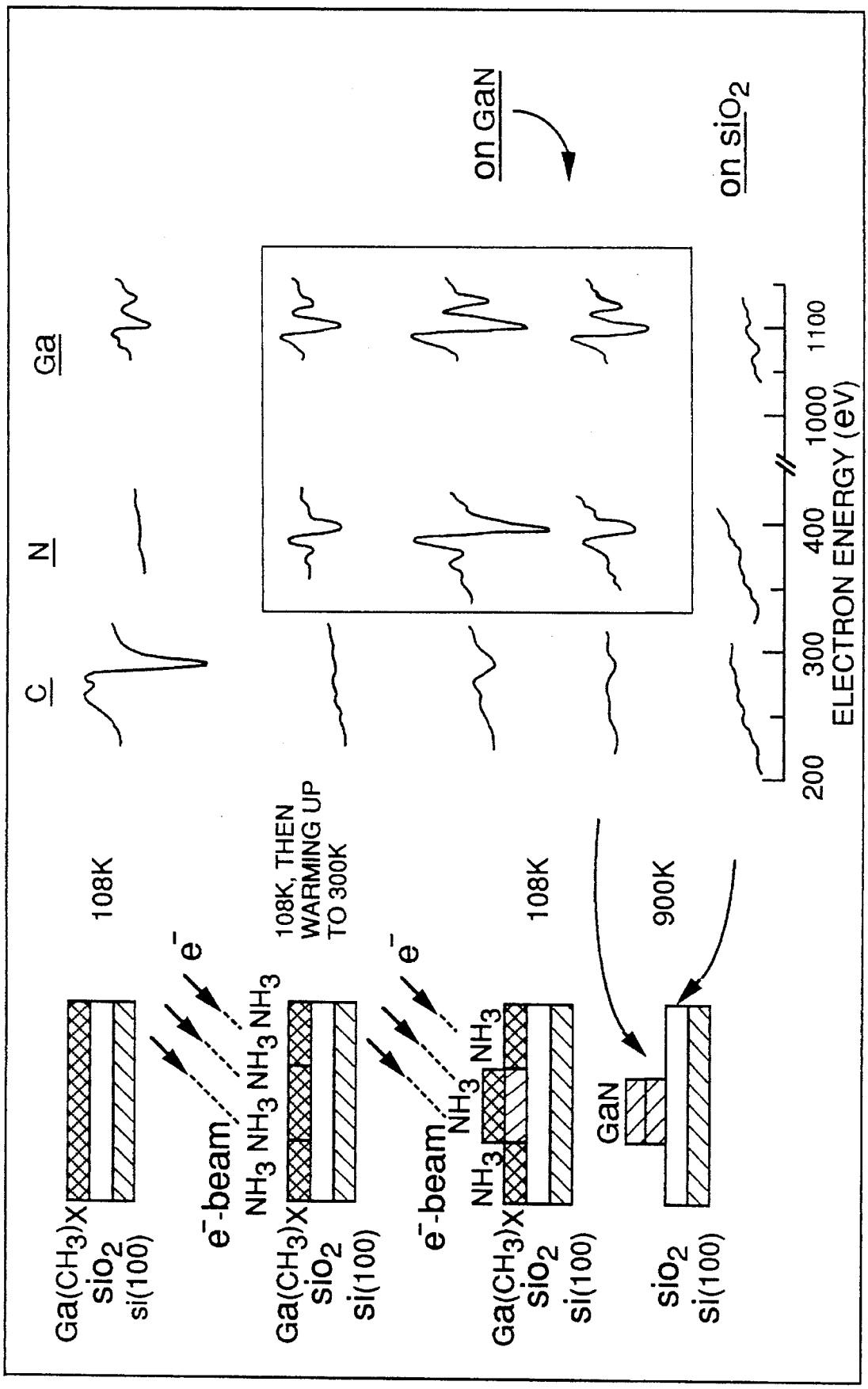
FIG. 5 discloses multilayer GaN synthesis.

The procedure shown in FIG. 4 was repeated a second time to grow a second layer of GaN on the dot. FIG. 5 discloses multilayer GaN synthesis on $SiO_2$ by an electron-induced reaction of $Ga(CH_3)_x$ with $NH_3$ at 108K. In FIG. 5, again, almost complete removal of carbon has been achieved by the electron-beam+$NH_3$ treatment, and prominent N and Ga Auger features are observed to remain in the irradiated region following heating to 900K. Upon heating the substrate to 900K, almost no residual species are seen on the non-irradiated regions, but the GaN dot is preserved, indicating its high thermal stability.

N(KLL) Auger lineshape study of GaN produced by electron beam activation was done as follows:

EXAMPLE III

Figure 6:
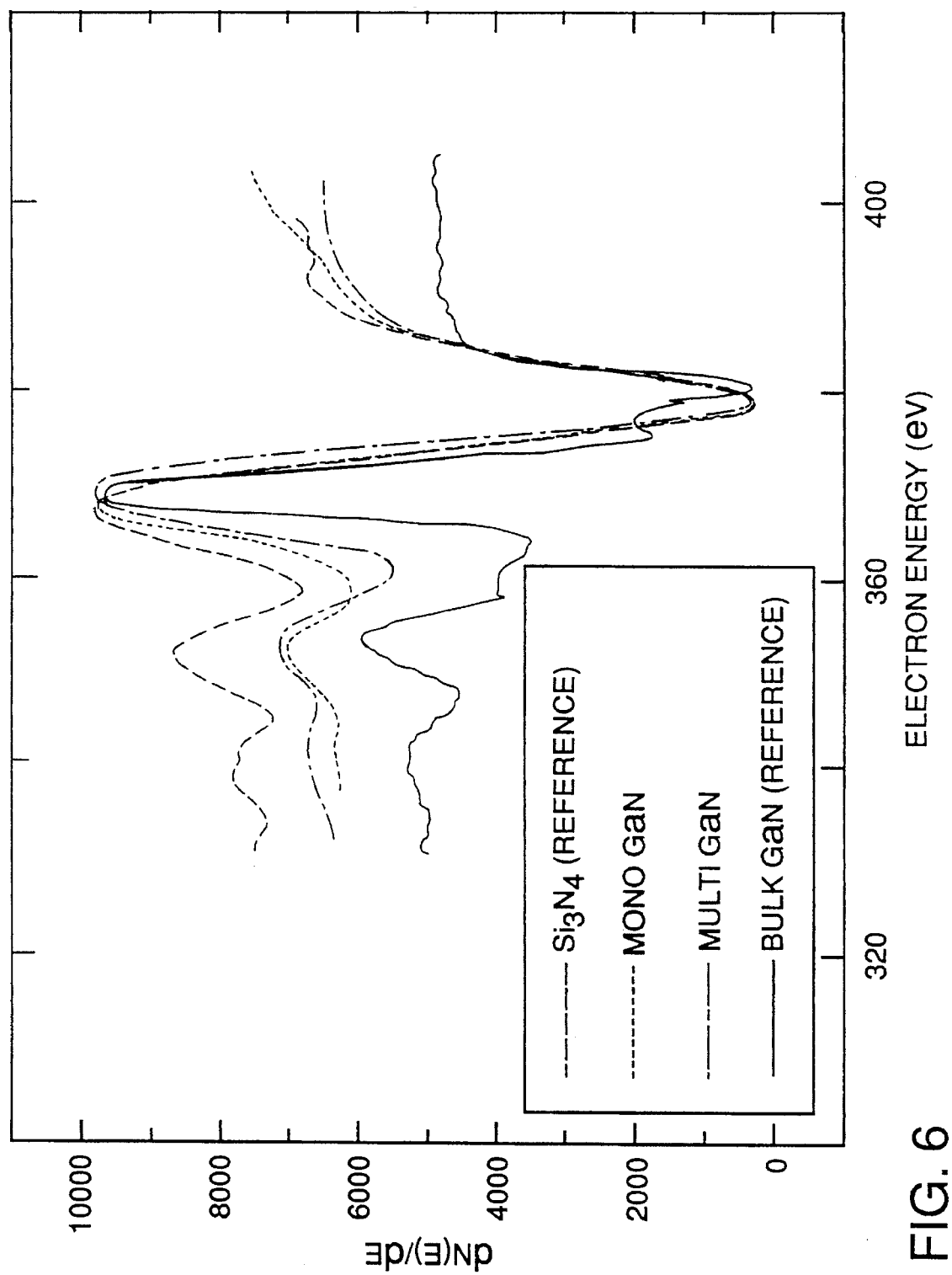
FIG. 6 shows Auger lineshapes of $Si_3N_4$ and GaN.

FIG. 6 discloses normalized and superimposed lineshapes of the N(KLL) Auger signal with increasing thickness of the GaN film. A comparison to a reference thick film of GaN and a reference $Si_3N_4$ film is given. FIG. 6 shows Auger studies of the N(KLL) feature from the GaN dot, both for monolayer preparation (as in FIG. 4) and for multilayer preparation (as in FIG. 5). In addition, in FIG. 6 the normalized N(KLL) Auger line from a thick layer of GaN and from a thick layer of $Si_3N_4$ are shown for reference. For a film of GaN produced at the one monolayer level, both GaN and $Si_3N_4$ will be observed by Auger spectroscopy, since $Si_3N_4$ is also made by the electron beam induced process on the $SiO_2$ substrate. With increasing thickness of the GaN film, the N(KLL) Auger lineshape will approach that of GaN, but as long as the thickness of the GaN film is of the order of the escape depth of the Auger electrons (~10Å), there will be a contribution from the underlying $Si_3N_4$ also, as seen in FIG. 6. This may contribute to the lack of exact agreement in the N(KLL) Auger lineshape with that measured for the GaN standard.

The growth of a GaN line with the electron beam was done as follows:

EXAMPLE IV

Figure 7:
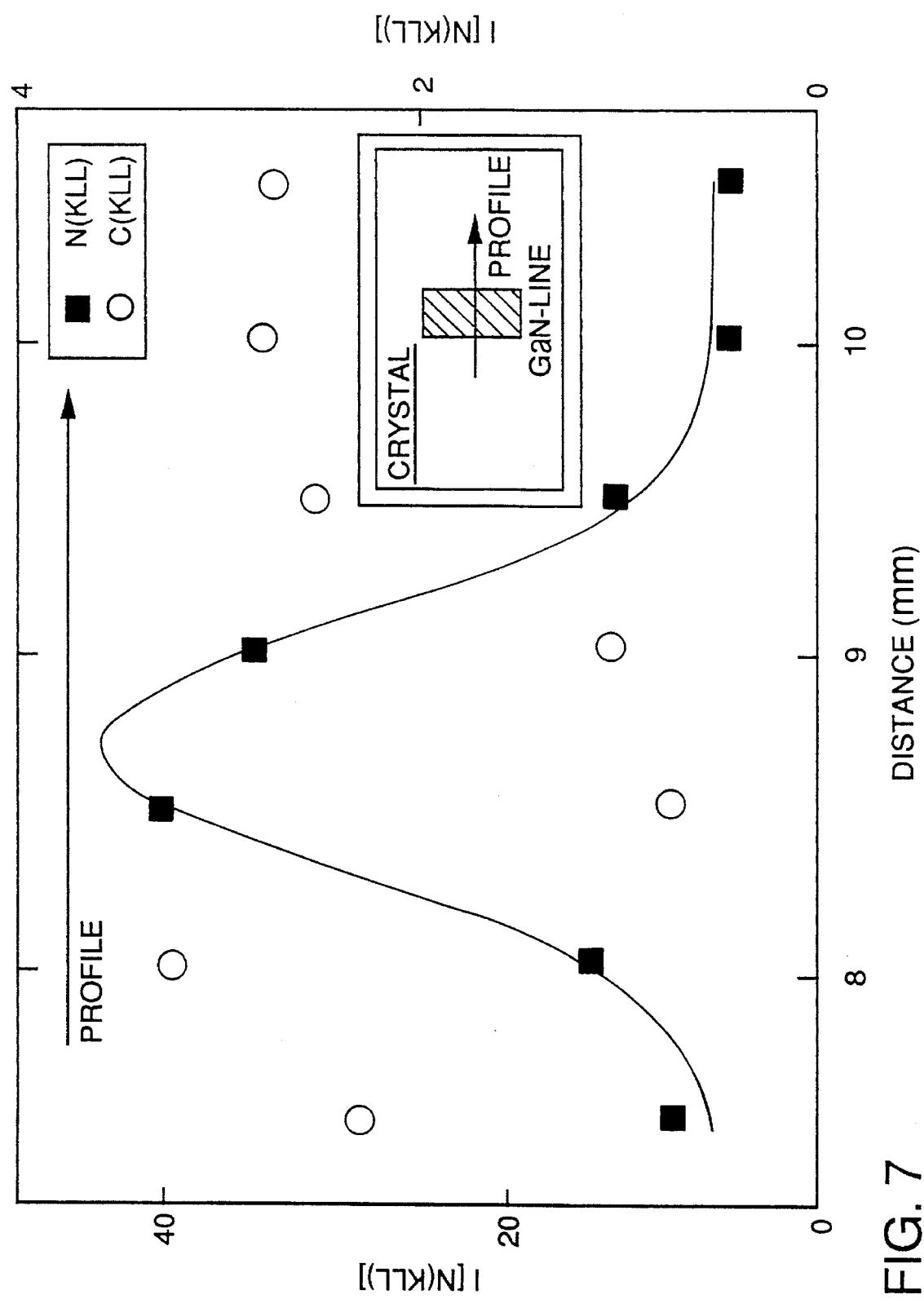
FIG. 7 discloses the profile of C and N over a GaN-line produced by an electron beam.

The procedure to produce a dot of GaN was modified to produce a line of GaN, and the Auger profile perpendicular to the line was then acquired as shown in FIG. 7. FIG. 7 discloses a profile of C(KLL) and N(KLL) Auger signals across a GaN line grown according to the procedure of this paper by scanning the electron beam. The line was grown at 108K without heating subsequently, so that outside the line both $Ga(CH_3)_x$ and $NH_3$ remain adsorbed. The C(KLL) Auger signal is small on the GaN line due to the electron-induced reaction of atomic H from $NH_3$ with the surface $CH_3$ groups, causing carbon to be lost. Off the line, the C(KLL) signal is high, indicating the presence of adsorbed $Ga(CH_3)_x$ on both sides of the line. The N(KLL) Auger signal shows the opposite behavior. Outside the line, adsorbed $NH_3$ (low signal) is seen. In contrast, inside the GaN line region, the N(KLL) signal is quadrupled. The data are arbitrarily fit to a Gaussian profile but the actual GaN lineshape cannot be determined in this experiment.

The experiments shown above indicate that GaN films can be grown using the electron impact of $NH_3$ to produce atomic H which then reacts with the Ga—$CH_3$ moieties, displacing the $CH_3$ group. The production of GaN is indicated by the following facts:

(1) Carbon is removed by the action of the atomic H atoms produced by electron bombardment.

(2) Gallium and nitrogen are thermally fixed in the dot or line which has been subjected to electron irradiation.

(3) Gallium and nitrogen are not thermally fixed external to the irradiated region.

(4) The GaN produced is thermally stable to 900K in the regions where it is deposited.

(5) The N(KLL) Auger line shape can be explained by the production of a GaN layer on top of a $Si_3N_4$ layer which is also produced on the $SiO_2$.

The following conclusions were reached:

1. The reaction between the Ga—$CH_3$ bond and atomic H occurs near 100K with the elimination of carbon either as $CH_3$ and/or $CH_4$. This process occurs with zero activation energy in accordance with theoretical expectations.

2. The efficiency of the reaction per incident H atom is of the order of $10^{-2}$. The $CH_3$ extraction reaction is first-order in $CH_3$ coverage on the surface.

3. Using an electron beam, incident on adsorbed $NH_3$, atomic H is generated in the irradiated region of the surface. This atomic hydrogen is used to activate the Ga—$CH_3$ bond, and GaN is then produced.

4. This new synthesis method achieves the low temperature growth of GaN films on the $SiO_2$ substrate.

This new reaction, involving H atom insertion into Ga—$CH_3$ bonds, is important in MOCVD processes in which atomic H is present. The reaction between atomic hydrogen and the Ga—$CH_3$ chemical bond is thought to occur both in the gas phase, where high gas pressures compared to those used here are involved, and on the growing film surface, and applies to all of the group III metal alkyls containing $CH_3$, $C_2H_5$, etc. alkyl groups and Group V hydrides, such as hydrides of N, P and As. The findings discovered at low temperatures also apply directly to chemical vapor deposition at higher temperatures, where high equilibrium pressures of the metal alkyl are used to maintain its supply and surface coverage at the growing film surface.

Whereas particular embodiments of this invention have been described above for purposes of illustration, it will be evident to those skilled in the art that numerous variations of the details of the present invention may be made without departing from the invention as defined in the appended claims.

We claim:

1. A method of "synthesizing" a Group III-V compound semi-conducting film from a Group III metal alkyls and a Group V hydrides, the method comprising:

a. providing a vacuum chamber in which the synthesis takes place;

b. adsorbing at least one monolayer of said Group III metal alkyl on an inert substrate surface to form a film on said inert surface in said chamber;

c. backfilling said chamber with said Group V hydride;

d. adsorbing said Group V hydride on said surface;

e. providing atomic hydrogen atoms from electron-induced dissociation of said Group V hydride adsorbed on said surface;

f. inducing an electron-induced depletion of carbon dependent on the pressure and surface coverage of said Group V hydride;

g. retaining substantially all said Group III metal on said inert substrate surface; and h. producing a thermally stable Group III-V compound semi-conducting film on said inert substrate surface.

2. The method of claim 1, including reacting said atomic hydrogen dissociated from said Group V hydride with said Group III alkyl groups adsorbed on said inert surface.

3. The method of claim 2, including increasing the rate of extraction of said alkyl groups by increasing the rate of production of said atomic hydrogen atoms from said group V hydride on said surface.

4. The method of claim 3, including repeating said procedure to provide multilayer Group III-V compound semiconductor films.

5. The method of claim 4, including producing said atomic hydrogen atoms by an electron beam.

6. The method of claim 5, including heating said crystal to about 200–900K after growth of a first and higher layers.

7. The method of claim 6, including providing said vacuum chamber with a base pressure of about $1 \times 10^{-10}$ torr.

8. The method of claim 7, including forming said monolayer of said Group III metal alkyls on an $SiO_2$ inert surface at about 97 to 138K.

9. A method of "synthesizing" Group III-V compound semi-conducting film from Group III metal alkyls and Group V hydrides, the method comprising:

a. providing a vacuum chamber in which the synthesis takes place;

b. adsorbing at least one monolayer of said Group III metal alkyl on an $SiO_2$ inert substrate surface at about 97 to 138K to form a film on said inert surface in said chamber;

c. backfilling said chamber with a Group V hydride;

d. adsorbing said Group V hydride on said surface;

e. providing atomic hydrogen atoms by using an electron beam in electron-induced dissociation of said Group V hydride adsorbed on said surface;

f. reacting said atomic hydrogen dissociated from said Group V hydride with said Group III alkyl groups adsorbed on said inert surface;

g. increasing the rate of extraction of said alkyl groups by increasing the rate of production of said atomic hydrogen atoms from said Group V hydride on said surface;

h. inducing an electron-induced depletion of carbon dependent on the pressure and surface coverage of said Group V hydride;

i. retaining substantially all said Group III metal on said inert substrate surface; and j. producing a thermally stable Group III-V compound semi-conducting film on said insert substrate surface;

k. repeating said procedure to provide multilayer Group III-V compound semi-conductor films;

l. heating said crystal to about 200–900K after growth of a first and higher layers;

m. producing a multilayer Group III-V compound GaN film from $Ga(CH_3)_x$ and $NH_3$ adsorbed on said $SiO_2$ surface.

* * * * *